United States Patent
Komatsu et al.

(10) Patent No.: US 8,642,360 B2
(45) Date of Patent: Feb. 4, 2014

(54) METHOD FOR MANUFACTURING LIGHT-EMITTER, ORGANIC DISPLAY PANEL USING LIGHT-EMITTER, ORGANIC LIGHT-EMITTING DEVICE AND ORGANIC DISPLAY DEVICE

(75) Inventors: Takahiro Komatsu, Osaka (JP); Takayuki Takeuchi, Osaka (JP); Tetsuro Kondoh, Osaka (JP); Ryuuta Yamada, Kyoto (JP)

(73) Assignee: Panasonic Corporation, Osaka (JP)

( * ) Notice: Subject to any disclaimer, the term of this patent is extended or adjusted under 35 U.S.C. 154(b) by 139 days.

(21) Appl. No.: 13/289,426

(22) Filed: Nov. 4, 2011

(65) Prior Publication Data

US 2012/0049211 A1 Mar. 1, 2012

Related U.S. Application Data

(63) Continuation of application No. PCT/JP2010/004376, filed on Jul. 5, 2010.

(51) Int. Cl.
*H01L 33/40* (2010.01)

(52) U.S. Cl.
USPC ............. 438/22; 438/29; 438/82; 438/99; 257/40; 257/88; 257/98; 257/E21.001; 257/E33.062

(58) Field of Classification Search
USPC ............ 257/40, 88, 98, E21.001, E33.062, 257/E33.001; 438/22, 29, 82, 99
See application file for complete search history.

(56) References Cited

U.S. PATENT DOCUMENTS

| | | |
|---|---|---|
| 5,443,922 A | 8/1995 | Nishizaki et al. |
| 7,196,467 B2 * | 3/2007 | Takamura et al. ............ 313/506 |
| 2002/0037429 A1 * | 3/2002 | Sato et al. ............. 428/690 |
| 2005/0116629 A1 * | 6/2005 | Takamura et al. ............ 313/506 |
| 2007/0029539 A1 * | 2/2007 | Yashima et al. ............. 257/13 |
| 2007/0160938 A1 | 7/2007 | Takamura et al. |
| 2007/0241665 A1 | 10/2007 | Sakanoue et al. |
| 2009/0115318 A1 * | 5/2009 | Gregory et al. ............. 313/504 |
| 2010/0051993 A1 * | 3/2010 | Shimoda et al. ............. 257/98 |
| 2010/0181554 A1 | 7/2010 | Yoshida et al. |

(Continued)

FOREIGN PATENT DOCUMENTS

| | | |
|---|---|---|
| JP | 05-163488 | 6/1993 |
| JP | 2003-257663 | 9/2003 |

(Continued)

OTHER PUBLICATIONS

International Search Report of PCT/JP2010/004376, dated Oct. 5, 2010.

*Primary Examiner* — Thinh T Nguyen
(74) *Attorney, Agent, or Firm* — Greenblum & Bernstein, P.L.C.

(57) ABSTRACT

A resin material layer including photosensitive resin material is formed on an interlayer on an underlayer. By partially exposing and developing the resin material layer using developer in which the resin material layer and the interlayer are soluble, an uncured portion of the resin material layer is removed to form an opening penetrating to the interlayer, and the developer infiltrates into the interlayer via the opening to remove at least surfaces of first and second portions of the interlayer. The first portion corresponds to the opening. The second portion surrounds the first portion. Each bank is formed by heating a remaining portion of the resin material layer to soften an overhanging portion above a space formed by the surface of the second portion being removed, so that the overhanging portion flows downward to fill the space, cover an exposed portion of the interlayer, and contact the underlayer or the interlayer.

10 Claims, 12 Drawing Sheets

(56) References Cited

U.S. PATENT DOCUMENTS

| | | |
|---|---|---|
| 2010/0213827 A1 | 8/2010 | Yoshida et al. |
| 2010/0258833 A1 | 10/2010 | Okumoto et al. |
| 2010/0295033 A1 | 11/2010 | Rokuhara et al. |
| 2011/0042703 A1 | 2/2011 | Okumoto et al. |

FOREIGN PATENT DOCUMENTS

| | | |
|---|---|---|
| JP | 2004-234901 | 8/2004 |
| JP | 2006-032156 | 2/2006 |
| JP | 2007-288074 | 11/2007 |
| JP | 2008-034198 | 2/2008 |
| JP | 2008-135318 | 6/2008 |
| JP | 2009-506490 | 2/2009 |
| JP | 2010-067349 | 3/2010 |
| JP | 4439589 | 3/2010 |
| WO | 2009/087876 | 7/2009 |
| WO | 2009/107323 | 9/2009 |
| WO | 2010/032443 | 3/2010 |

* cited by examiner

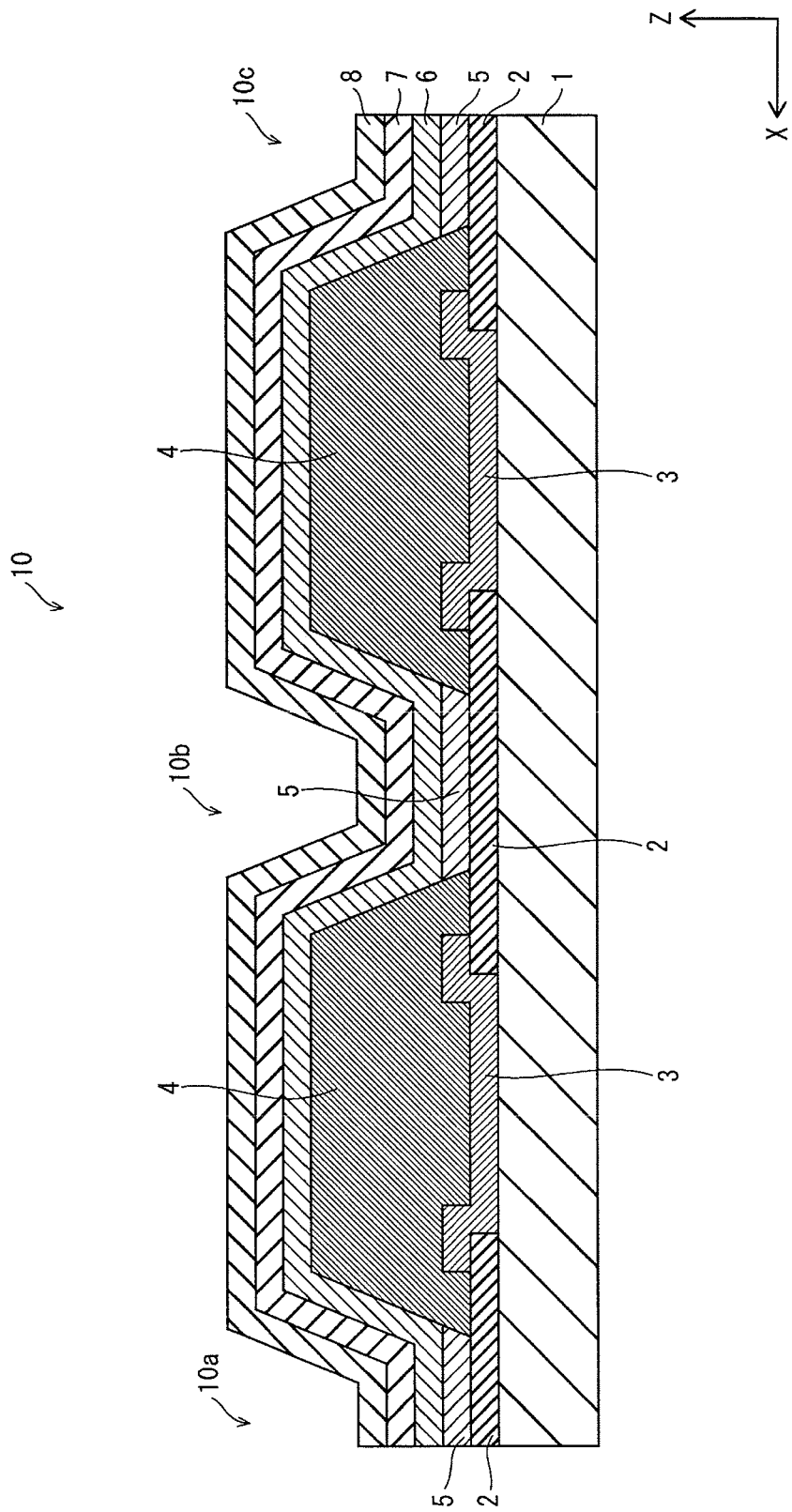

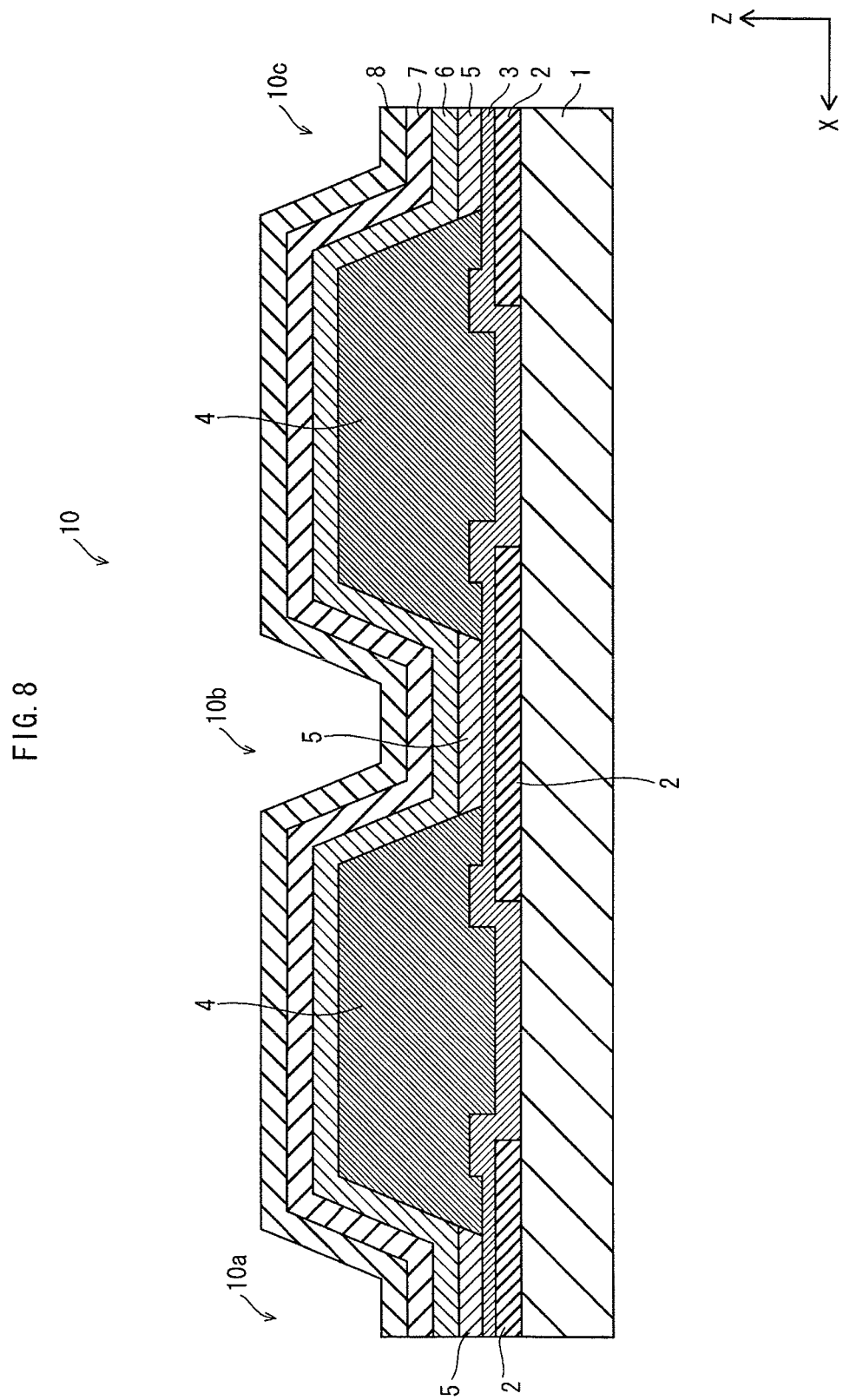

METHOD FOR MANUFACTURING LIGHT-EMITTER, ORGANIC DISPLAY PANEL USING LIGHT-EMITTER, ORGANIC LIGHT-EMITTING DEVICE AND ORGANIC DISPLAY DEVICE

This is a continuation of International Application PCT/JP2010/004376, with an international filing date of Jul. 5, 2010.

TECHNICAL FIELD

The present invention relates to a method for manufacturing a light-emitter, an organic display panel using the light-emitter, an organic light-emitting device and an organic display device.

BACKGROUND ART

In recent years, progress has been made in research and development of an organic electroluminescence element (hereinafter, referred to as an "organic EL element"). The organic EL element is a light-emitter that uses the phenomenon of electroluminescence occurring in organic material. The organic EL element has a structure in which an organic light-emitting layer is interposed between a first electrode (anode) and a second electrode (cathode). Banks formed from an insulating material are arranged laterally along the organic light-emitting layer, and define a shape of the organic light-emitting layer.

An example of steps of manufacturing the organic EL element is briefly described as follows. First, a first electrode is formed on a substrate, and a bank material layer for forming a bank is formed on the substrate so as to cover the first electrode. Next, by partially exposing the bank material layer and then developing the bank material layer using developer, an uncured portion of the bank material layer is removed to form an opening corresponding in position to the first electrode. After the formation of the opening, a functional layer including an organic light-emitting layer is formed on the first electrode exposed from the opening, and a second electrode is formed on the functional layer (see Patent Literature 1, for example).

CITATION LIST

Patent Literature

[Patent Literature 1]
  Japanese Patent No. 4439589

SUMMARY OF INVENTION

Technical Problem

When the opening is formed in the bank material layer corresponding in position to the first electrode, the bank material layer formed on the first electrode is not removed completely by the development processing but a part of the bank material layer remains on the first electrode (hereinafter, the remaining part of the bank material layer is referred to as a "bank residue").

In general, a bank is formed from a resin material such as UV cured resin, and the resin material has insulating properties. Therefore, the bank residue existing on the first electrode can cause an increase of drive voltage in the organic EL element.

Since the bank is formed from a resin material, i.e. an organic material, as described above, it is possible to remove the bank residue by UV ozone treatment or the like. However, there is a problem that such treatment can result in a loss of liquid repellency in the bank.

The present invention aims to provide a method for manufacturing a light-emitter that reduces the bank residue while maintaining the liquid repellency in the bank and prevents a newly perceived problem from occurring.

Solution to Problem

In order to solve the above problem, one aspect of the present invention is a method for manufacturing a light-emitter, comprising: a first step of forming, on a substrate, an underlayer including a first electrode; a second step of forming an interlayer on the underlayer; a third step of forming, on the interlayer, a resin material layer including a photosensitive resin material; a fourth step of, by partially exposing the resin material layer and then developing the resin material layer using developer in which the resin material layer and the interlayer are soluble, removing an uncured portion of the resin material layer to form an opening penetrating, to the interlayer, and infiltrating the developer into the interlayer via the opening to remove at least surfaces of first and second portions of the interlayer, the first portion corresponding in position to the opening, the second portion surrounding the first portion; a fifth step of forming each of a plurality of banks from the resin material layer by heating a portion of the resin material layer remaining after the fourth step to soften an overhanging portion of the resin material layer above a space formed by the surface of the second portion being removed, so that the overhanging portion flows downward to fill the space, cover a portion of the interlayer exposed to the space, and be in contact with the underlayer or the interlayer; a sixth step of forming, in an area defined by adjacent banks of the plurality of banks, a functional layer including an organic light-emitting layer; and a seventh step of forming a second electrode on the functional layer.

Advantageous Effects of Invention

In the method for manufacturing the light-emitter as one aspect of the present invention, after the underlayer including the first electrode is formed on the substrate, the resin material layer is not formed on the underlayer but formed on the interlayer formed on the underlayer.

When the resin material layer is developed in the fourth step, a portion of the resin material layer corresponding in position to the first portion of the interlayer (hereinafter, referred to as an "opening-target portion") is removed together with the surfaces of the first and second portions of the interlayer to form the opening penetrating to the interlayer.

Since the surfaces of the first and second portions of the interlayer are removed, the opening-target portion formed on the first portion of the interlayer is undermined and removed together with the surfaces of the first and second portions of the interlayer. The possibility of a part of the opening-target portion remaining as a residue after the development processing is reduced in the above-mentioned manner.

When the resin material layer is developed in the fourth step, not only the first portion of the interlayer corresponding in position to the opening but also the second portion of the interlayer surrounding the first portion are removed. Since the portion larger than the first portion corresponding in position to the opening is removed, it becomes possible to surely remove the opening-target portion.

As a result of removing the second portion of the interlayer in the fourth step, a space is formed under the resin material layer. Therefore, a problem such as uplift and detachment of the resin material layer is newly perceived.

In order to solve such a problem, in the method for manufacturing the light-emitter as one aspect of the present invention, the overhanging portion of the resin material layer corresponding in position to the second portion is softened by heating, so that the overhanging portion flows downward to fill the space and cover a portion of the interlayer exposed to the space. The overhanging portion of the resin material layer corresponding in position to the second portion is in contact with the underlayer or the interlayer. Each bank is formed in the above-mentioned manner. Therefore, adhesion of the bank to the underlayer or the interlayer is improved, and the newly perceived problem such as the uplift and detachment of the bank is prevented from occurring.

BRIEF DESCRIPTION OF DRAWINGS

FIG. 3 is an end elevation schematically showing a part of a cross section of the organic EL display panel in Embodiment 1.

FIG. 8 is an end elevation schematically showing a part of a cross section of an organic EL display panel in a modification of Embodiment 1.

DESCRIPTION OF EMBODIMENTS

[Embodiments]

Figure 1:
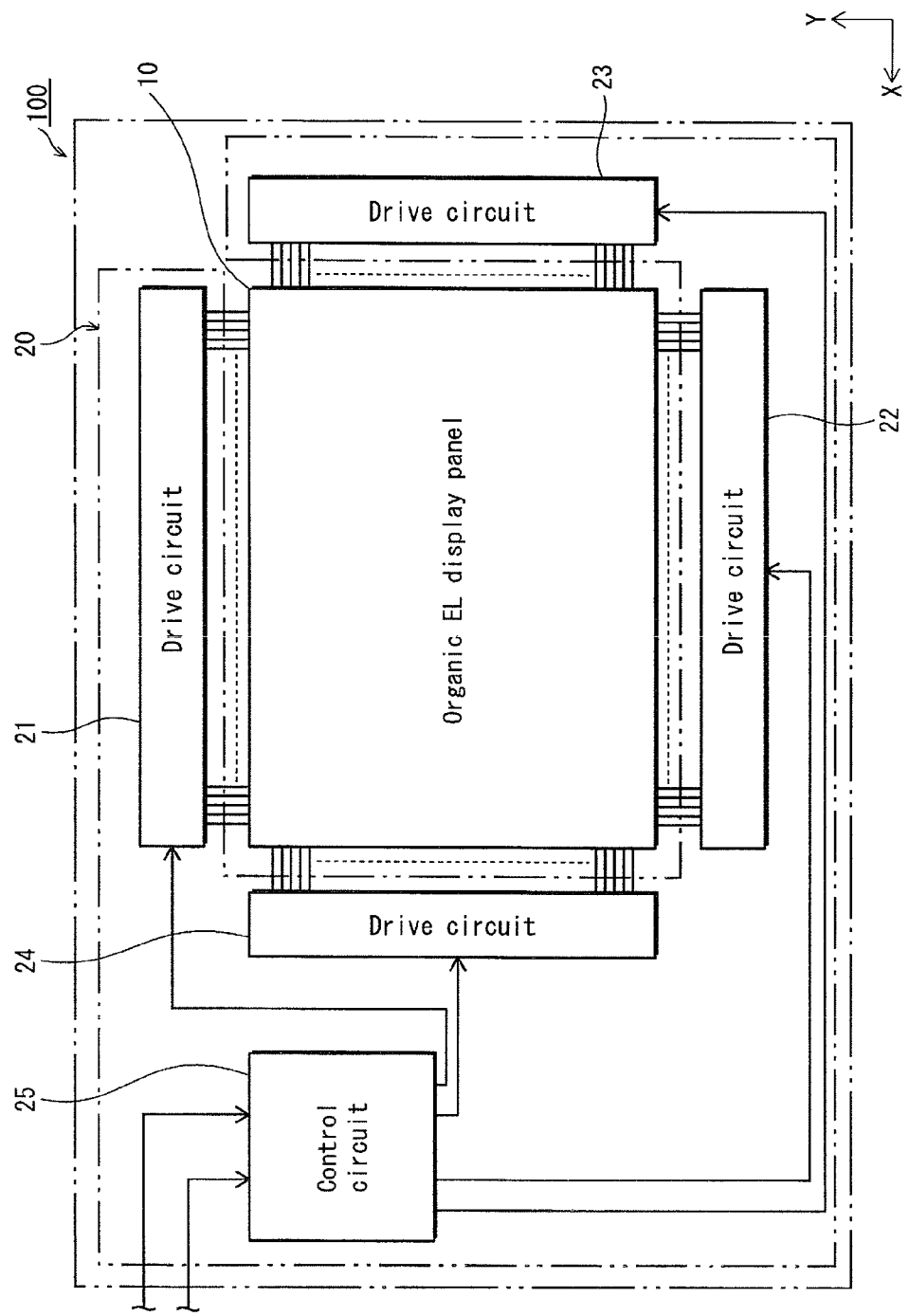
FIG. 1 is a block diagram schematically showing an overall configuration of a display device 1 in Embodiment 1.

One aspect of the present invention is a method for manufacturing a light-emitter, comprising: a first step of forming, on a substrate, an underlayer including a first electrode; a second step of forming an interlayer on the underlayer; a third step of forming, on the interlayer, a resin material layer including a photosensitive resin material; a fourth step of, by partially exposing the resin material layer and then developing the resin material layer using developer in which the resin material layer and the interlayer are soluble, removing an uncured portion of the resin material layer to form an opening penetrating to the interlayer, and infiltrating the developer into the interlayer via the opening to remove at least surfaces of first and second portions of the interlayer, the first portion corresponding in position to the opening, the second portion surrounding the first portion; a fifth step of forming each of a plurality of banks from the resin material layer by heating a portion of the resin material layer remaining after the fourth step to soften an overhanging portion of the resin material layer above a space formed by the surface of the second portion being removed, so that the overhanging portion flows downward to fill the space, cover a portion of the interlayer exposed to the space, and be in contact with the underlayer or the interlayer; a sixth step of forming, in an area defined by adjacent banks of the plurality of banks, a functional layer including an organic light-emitting layer; and a seventh step of forming a second electrode on the functional layer.

In the method for manufacturing the light-emitter as one aspect of the present invention, after the underlayer including the first electrode is formed on the substrate, the resin material layer is not formed on the underlayer but is formed on the interlayer formed on the underlayer.

When the resin material layer is developed in the fourth step, the opening-target portion is removed together with the surfaces of the first and second portions of the interlayer to form the opening penetrating to the interlayer.

Since the surfaces of the first and second portions of the interlayer are removed, the opening-target portion formed on the first portion of the interlayer is undermined and removed together with the surfaces of the first and second portions of the interlayer. The possibility of a part of the opening-target portion remaining as a residue after the development processing is reduced in the above-mentioned manner.

When the resin material layer is developed in the fourth step, not only the first portion of the interlayer corresponding in position to the opening but also the second portion of the interlayer surrounding the first portion are removed. Since the portion larger than the first portion corresponding in position to the opening is removed, it becomes possible to surely remove the opening-target portion.

As a result of removing the second portion of the interlayer in the fourth step, a space is formed under the resin material layer. Therefore, a problem such as uplift and detachment of the resin material layer is newly perceived.

In order to solve such a problem, in the method for manufacturing the light-emitter as one aspect of the present invention, the overhanging portion of the resin material layer corresponding in position to the second portion is softened by heating, so that the overhanging portion flows downward to fill the space and cover a portion of the interlayer exposed to the space. The overhanging portion of the resin material layer corresponding in position to the second portion is in contact with the underlayer and the interlayer. Each bank is formed in the above-mentioned manner. Therefore, adhesion of the bank to the underlayer or the interlayer is improved, and the newly perceived problem such as the uplift and detachment of the bank is prevented from occurring.

Here, as another aspect of the present invention, the interlayer and the resin material layer may be etched with the developer.

In the method for manufacturing the light-emitter as the other aspect of the present invention, since the interlayer and the resin material layer are etched with the same developer, there is no need to add another step of removing the interlayer. Therefore, the method is effective in terms of manufacturing.

Here, as another aspect of the present invention, the interlayer may be formed from any one of tungsten oxide, molybdenum oxide and tungsten-molybdenum oxide, the resin material layer may be formed from any one of acrylate resin, polyimide resin and phenolic resin, and TMAH (tetra methyl ammonium hydroxide) may be used as the developer.

Here, as another aspect of the present invention, in the first step, the underlayer may be formed from a material that is insoluble in the developer.

In the method for manufacturing the light-emitter as the other aspect of the present invention, since the underlayer is formed from the material that is insoluble in the developer, it is possible to prevent the underlayer from dissolving in the developer.

Here, as another aspect of the present invention, the underlayer may include only the first electrode formed from one of ITO and IZO.

Here, as another aspect of the present invention, in the fifth step, the plurality of banks may be formed so that the adjacent banks are out of contact with each other, and, in the sixth step, the functional layer may be formed in the opening between the adjacent banks.

Here, as another aspect of the present invention, a portion other than the surfaces of the first and second portions of the interlayer may remain on the underlayer after the fourth step, and the functional layer may be formed on the remaining portion of the interlayer in the sixth step.

In this case, as yet another aspect of the present invention, the interlayer may be a charge injection transport layer that injects and/or transports charge into the functional layer.

In the method for manufacturing the light-emitter as the other aspect of the present invention, since a portion of the charge injection transport layer remains on the underlayer after the fourth step, it is possible to effectively inject and/or transport charge into the functional layer.

Here, as another aspect of the present invention, the first electrode included in the underlayer may be an anode, and the charge injection transport layer may be a hole injection layer that injects holes into the functional layer.

In the method for manufacturing the light-emitter as the other aspect of the present invention, since the charge injection transport layer is the hole injection layer that injects holes into the functional layer, it is possible to effectively inject holes into the functional layer.

Here, as another aspect of the present invention, the first and second portions of the interlayer may be completely removed in the fourth step, and the functional layer may be formed on the underlayer in the sixth step.

Here, another aspect of the present invention is an organic display panel using the light-emitter manufactured by the method according to any one of the above-mentioned aspects of the present invention.

The organic display panel as the other aspect of the present invention uses the light-emitter manufactured by the method as one aspect of the present invention. Therefore, a residue of the resin material layer is not left on the first electrode. As a result, the increase of the drive voltage in the organic display panel as the other aspect of the present invention is suppressed.

Here, another aspect of the present invention is an organic light-emitting device using the light-emitter manufactured by the method according to any one of the above-mentioned aspects of the present invention.

The organic light-emitting device as the other aspect of the present invention uses the light-emitter manufactured by the method as one aspect of the present invention. Therefore, a residue of the resin material layer is not left on the first electrode. As a result, the increase of the drive voltage in the organic light-emitting device as the other aspect of the present invention is suppressed.

Here, another aspect of the present invention is an organic display device using the light-emitter manufactured by the method according to any one of the above-mentioned aspects of the present invention.

The organic display device as the other aspect of the present invention uses the light-emitter manufactured by the method as one aspect of the present invention. Therefore, a residue of the resin material layer is not left on the first electrode. As a result, the increase of the drive voltage in the organic display device as the other aspect of the present invention is suppressed.

[Embodiment 1]

<Overall Configuration of Display Device 100>

The following describes an overall configuration of a display device 100 in Embodiment 1, with reference to FIG. 1. FIG. 1 is a block diagram schematically showing an overall configuration of the display device 100.

As shown in FIG. 1, the display device 100 includes an organic EL display panel 10 and a drive control unit 20 connected to the organic EL display panel 10. The organic EL display panel 10 is a top-emission type organic EL display panel that uses the phenomenon of electroluminescence occurring in organic material.

The drive control unit 20 includes four drive circuits 21 to 24 and a control circuit 25.

Note that the arrangement of the organic EL display panel 10 and the drive control unit 20 in the display device 100 is not limited to that shown in FIG. 1.

<Configuration of Organic EL Display Panel 10>

(Detailed Configuration of Organic EL Display Panel 10)

Figure 2:
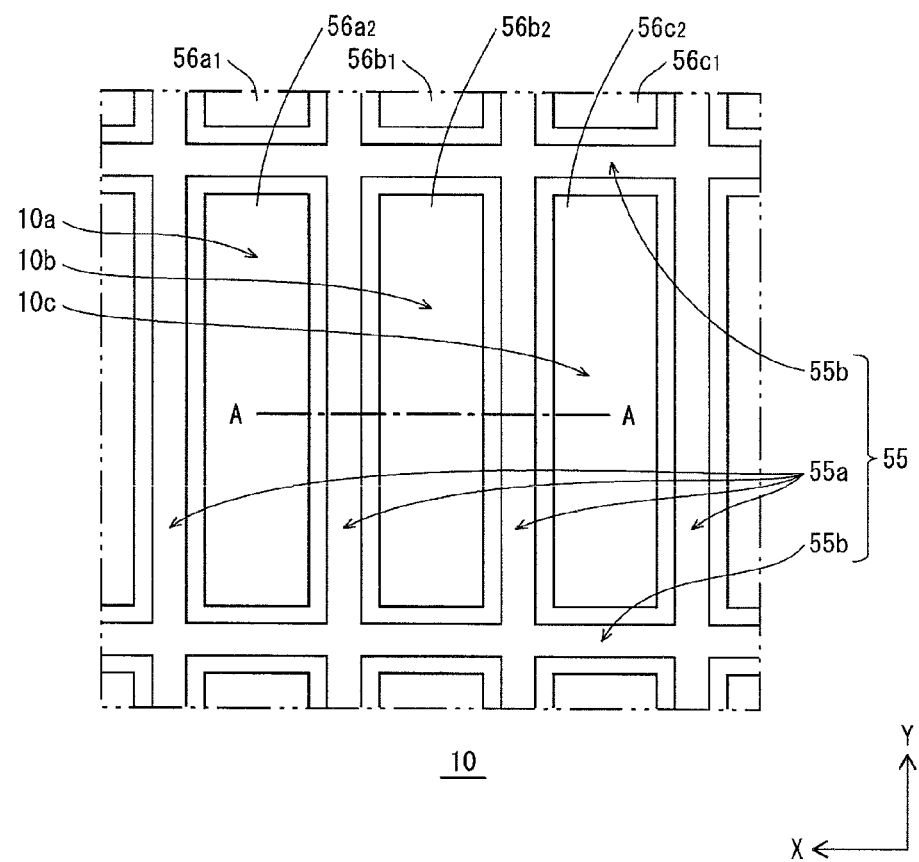
FIG. 2 is a plan view showing a part of an organic EL display panel in Embodiment 1.

The following describes a configuration of the organic EL display panel 10 in detail. FIG. 2 schematically shows the arrangement of organic light-emitting layers and banks in the organic EL display panel 10 in Embodiment 1.

In an example shown in FIG. 2, a pixel bank structure in which banks 55 are arranged in a lattice pattern is adopted. Each bank extending along a Y axis 55a delimits consecutive organic light-emitting layers 56a1, 56b1 and 56c1 arranged along an X axis as well as consecutive organic light-emitting layers 56a2, 56b2 and 56c2 arranged along the X axis.

The organic light-emitting layers are delimited in units of sub-pixels. Three consecutive sub-pixels 10a, 10b and 10c arranged along the X axis constitute one pixel as a whole.

On the other hand, each bank extending along the X axis 55b delimits adjacent organic light-emitting layers 56a1 and 56a2 arranged along the Y axis, adjacent organic light-emitting layers 56b1 and 56b2 arranged along the Y axis, and adjacent organic light-emitting layers 56c1 and 56c2 arranged along the Y axis.

FIG. 3 is an end elevation schematically showing a cross section of a chief part of the organic EL display 10 in Embodiment 1 taken along the line A-A of FIG. 2. As shown in FIG. 3, on a TFT substrate 1 of the organic EL display panel 10 in Embodiment 1, first electrodes (anodes) 2 are formed in a matrix by patterning in units of sub-pixels. Between the adjacent first electrodes 2 formed on the TFT substrate 1, a residue removal layer 3, which is an interlayer, is formed such that a part of the residue removal layer 3 covers an end of the first electrode 2.

Also, between the adjacent first electrodes 2, a bank 4 is formed so as to cover the residue removal layer 3. In an area defined by the banks 4, an organic light-emitting layer 5 is formed.

On the organic light-emitting layer 5, an electron injection layer 6, a second electrode (cathode) 7 and a sealing layer 8 are further formed continuously across consecutive organic light-emitting layers 5, passing over the banks 4.

The following describes a material and others for each component of the organic EL display panel 10 in detail.

<Configuration of Each Component>

The TFT substrate 1 has a structure in which a TFT (not illustrated), a wiring member (not illustrated), a passivation film for covering the TFT (not illustrated) and the like are formed on a substrate body formed from an insulating material such as alkali-free glass, soda glass, nonluminescent glass, phosphate glass, boric-acid glass, quartz, acrylic resin, styrene resin, polycarbonate resin, epoxy resin, polyethylene, polyester, silicone resin and alumina. The substrate body may also be an organic resin film.

Note that an interlayer insulation film may be provided on the TFT substrate 1 so as to planarize a surface of the TFT substrate 1. The interlayer insulation film is formed from an insulating material such as polyimide resin and acrylic resin.

The first electrode 2 is formed from Ag (silver). Note that the first electrode 2 may be formed from a silver-palladium-copper alloy, a silver-rubidium-gold alloy, MoCr (a molybdenum-chrome alloy), NiCr (a nickel-chrome alloy), Al (aluminum), an aluminum alloy, ITO (Indium Tin Oxide), IZO (Indium Zinc Oxide) or the like. Since the organic EL display panel 10 in Embodiment 1 is a top-emission type display panel, it is preferable that the first electrode 2 be formed from a light-reflective material. It is also preferable that the first electrode 2 be formed from a material that is insoluble in developer used in a development processing (described later).

Note that a well-known transparent conductive film may be provided on a surface of the first electrode 2. As a material for the transparent conductive film, ITO (Indium Tin Oxide) is used, for example.

The residue removal layer 3 is formed from a metal oxide, for example. Examples of the metal oxide are tungsten oxide, molybdenum oxide and tungsten-molybdenum oxide. It is preferable that the residue removal layer 3 be formed from a material having charge injection and/or charge transport properties.

The bank 4 is formed from an organic material such as resin, and has insulating properties. Examples of the organic material are acrylic resin, polyimide resin and novolac-type phenolic resin. It is preferable that the bank 4 be resistant to organic solvent. Furthermore, the bank 4 is to be subjected to an etching processing, a baking processing and the like. Therefore, it is preferable that the bank 4 be formed from a highly resistant material so as not to be excessively deformed or degenerated by such a processing.

It is preferable that the organic light-emitting layer 5 be formed from a high-polymer material such as polyfluorene, polyphenylene vinylene, polyacetylene, polyphenylene, polyparaphenylene ethylene, poly(3-hexylthiophene) and their derivatives. Alternatively, it is preferable that the organic light-emitting layer 5 be formed from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group three metal, metal complex of oxine, rare earth metal complex, as recited in Japanese Patent Application Publication No. 5-163488.

The electron injection layer 6 has a function of transporting, to the organic light-emitting layer 5, electrons injected from the second electrode 7 (described later). It is preferable that the electron injection layer 6 be formed from barium, phthalocyanine, lithium fluoride, or a combination of these materials. Furthermore, it is preferable that the electron injection layer 6 be formed from an electron transport material doped with these materials.

The second electrode 7 is formed from ITO (Indium Tin Oxide) or IZO (Indium Zinc Oxide), for example. Since the organic EL display panel 10 is a top-emission type display panel, it is preferable that the second electrode 7 be formed from a light-transmissive material.

The sealing layer 8 has a function of preventing the organic light-emitting layer 5 and the like from being exposed to moisture and air. The sealing layer 8 is formed from a material such as SiO (Silicon Oxide), SiN (Silicon Nitride), SiON (Silicon Oxynitride), SiC (Silicon Carbide), SiOC (Carbon-containing Silicon Oxide), MN (Aluminum Nitride), $Al_2O_3$ (Aluminum Oxide). Since the organic EL display panel 10 is a top-emission type display panel, it is preferable that the sealing layer 8 be formed from a light-transmissive material.

Before the steps of manufacturing the organic EL display panel 10 in Embodiment 1 are described, the following describes, as a comparative example of Embodiment 1, steps of manufacturing an organic EL display panel in which the residue removal layer is not formed.

<Steps of Manufacturing Organic EL Display Panel in which Residue Removal Layer is not Formed>

FIGS. 4A-4E show an example of steps of manufacturing the organic EL display panel in which the residue removal layer is not formed. Note that a part of the organic EL display panel is schematically shown in FIGS. 4A-4E.

Figure 4A:
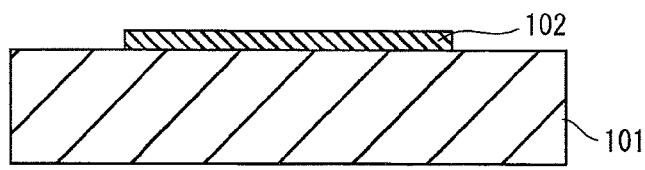
FIGS. 4A-4E are each process charts showing steps of manufacturing an organic EL display panel in which a residue removal layer is not formed.

First, as shown in FIG. 4A, an Ag thin film is formed on a principal surface of a TFT substrate 101 using a sputtering method. The formed Ag thin film is then patterned using photolithography or the like to form first electrodes 102 in a matrix.

Figure 4B:
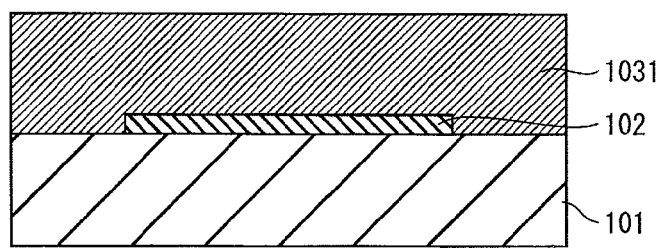
Figure 4C:
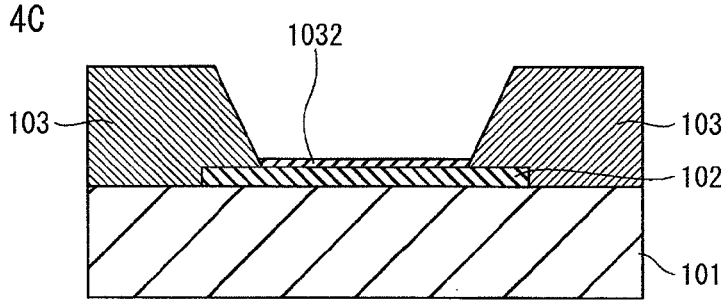

Next, as shown in FIG. 4B, a bank material layer 1031 formed from an insulating organic material is formed. The bank material layer 1031 is formed by application or the like.

Then, the bank material layer 1031 is covered with a mask having an opening of a predetermined shape. The bank material layer 1031 covered with the mask is exposed, and then an unnecessary portion of the bank material layer 1031 is washed away with developer (wet process). This completes the patterning of the bank material layer 1031. Banks 103 are formed in the above-mentioned manner (see FIG. 4C).

However, a portion of the bank material layer 1031 corresponding in position to an opening is not removed completely by the wet process but a part of the bank material layer 1031 remains on the first electrode 102 (hereinafter, the remaining part of the bank material layer 1031 is referred to as a "bank residue 1032").

This is considered to be because the first electrode 102 has a rough surface, and the bank residue is stuck in the rough surface of the first electrode 102. Therefore, although the developer infiltrates into the bank residue during the development processing, the developer cannot remove the bank residue and thus leaves the bank residue on the first electrode 102. The left bank residue 1032 is a film, and a thickness thereof is 4 nm, for example.

Figure 4D:
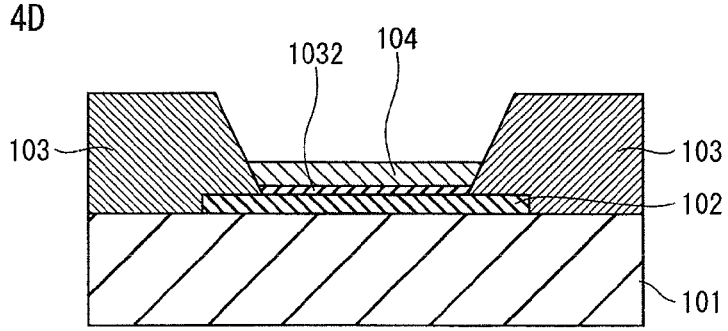
Figure 4E:
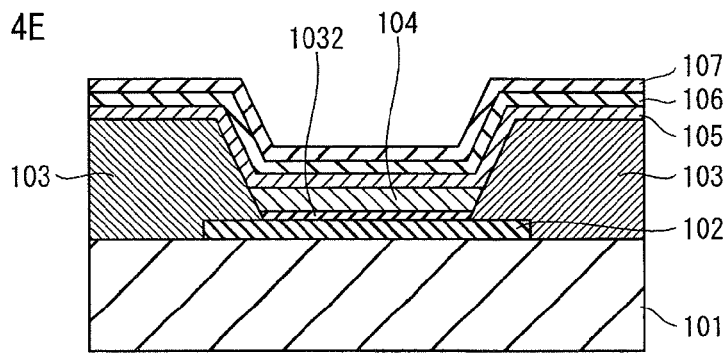

After the formation of the banks 103, as shown in FIG. 4D, an ink composition including an organic EL material (hereinafter, simply referred to as "ink") is dropped in an area defined by the banks 103 by the inkjet method or the like. By drying the ink, an organic light-emitting layer 104 is formed. However, since the bank residue 1032 is left on the first electrode 102, the organic light-emitting layer 104 is formed above the first electrode 102 via the bank residue 1032.

Next, a barium thin film as an electron injection layer 105 is formed using a vacuum evaporation method or the like. Then, an ITO thin film as a second electrode 106 is formed using a sputtering method or the like, and a sealing layer 107 is further formed (see FIG. 4E).

In the above-mentioned manufacturing method, since the bank residue 1032 having insulating properties is left on the first electrode 102, drive voltage at the time of driving the organic ET display panel can increase.

<Method for Manufacturing Organic EL Display Panel 10 in Embodiment 1>

The following describes an example of steps of manufacturing the organic EL display panel 10 in Embodiment 1. FIGS. 5A-5C and FIGS. 6A-6D show the example of steps of manufacturing the organic EL display panel 10 in Embodiment 1. Note that a part of the organic EL display panel 10 is schematically shown in FIGS. 5A-5C and FIGS. 6A-6D.

Figure 5A:
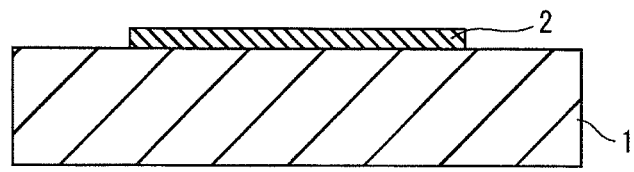
FIGS. 5A-5C are each process charts showing an example of steps of manufacturing the organic EL display panel in Embodiment 1.

First, as shown in FIG. 5A, an Ag thin film is formed on a principal surface of a TFT substrate 1 using a sputtering method. The formed Ag thin film is then patterned using photolithography or the like to form first electrodes 2 in a matrix. Note that the Ag thin film may be formed using a vacuum evaporation method or the like instead of using the sputtering method.

Figure 5B:
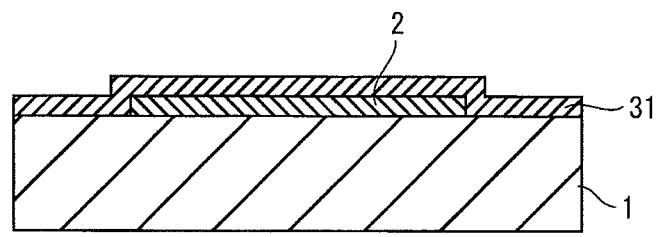

Next, as shown in FIG. 5B, on the TFT substrate 1 on which the first electrodes 2 have been formed, a residue removal layer 3, which is a $WO_x$, $Mo_xO_y$ or $Mo_xW_yO_z$ thin film, is formed from a composition containing $WO_x$, $Mo_xO_y$ or $Mo_xW_yO_z$ using technology such as vacuum evaporation and sputtering. It is preferable that a thickness of the residue removal layer 3 be in a range of several to several tens of nanometers, for example.

Figure 5C:
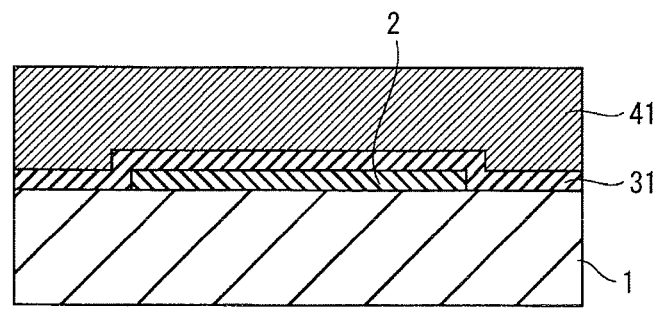

Next, as shown in FIG. 5C, a bank material layer 41 formed from an insulating organic material is formed on the residue removal layer 3. The bank material layer 41 is formed by application or the like.

Then, the bank material layer 41 is covered with a mask having an opening of a predetermined shape. The bank material layer 41 covered with the mask is exposed, and then an unnecessary portion of the bank material layer 41 is washed away with developer (e.g. TMAH (tetra methyl ammonium hydroxide) solution). This completes the patterning of the bank material layer 41. During the above-mentioned wet process, however, the residue removal layer 3 also dissolves with the developer. Therefore, not only the bank material layer 41 but also the residue removal layer 3 are removed, so that the first electrode 2 is partially exposed (see FIG. 6A). In this case, not only a first portion 3a of the residue removal layer 3 corresponding in position to an opening but also a second portion 3b of the residue removal layer 3 surrounding the first portion 3a dissolve (i.e. side etching).

As described above, not only the bank material layer 41 but also the residue removal layer 3 are removed by the wet process. A portion of the bank material layer 41 formed on the residue removal layer 3 is undermined and removed together with the residue removal layer 3. This reduces the possibility that the bank residue is left on the first electrode 2 after the development processing.

Also, since the bank material layer 41 and the residue removal layer 3 are etched with the same developer, there is no need to add another step of removing the residue removal layer 3. Therefore, this method is effective in terms of manufacturing.

Furthermore, since not only the first portion 3a but also the second portion 3b of the residue removal layer 3 dissolve, it is possible to surely remove the bank material layer 41. Since the second portion 3b dissolves, however, a space is formed under the bank material layer 41. Therefore, an overhanging portion of the bank material layer 41 that corresponds in position to the second portion 3b (hereinafter, simply referred to as an "overhanging portion") is out of contact with and rises from the first electrode 2. If left untreated, this can cause a new problem such as uplift and detachment of the bank.

In order to solve such a problem, the substrate 1 is baked to soften the overhanging portion, so that the overhanging portion flows downward. By the baking processing, the overhanging portion fills a space under the bank material layer 41 and covers a portion 3c of the residue removal layer 3 exposed to the space. The overhanging portion comes into contact with the first electrode 2 in the above-mentioned manner, and thus each bank 4 is formed (see FIG. 6B). Each bank 4 is completed in the above-mentioned manner.

Since each bank 4 is in contact with the first electrode 2, adhesion therebetween is improved. Therefore, it is possible to prevent a problem such as uplift and detachment of the bank from occurring.

Figure 6A:
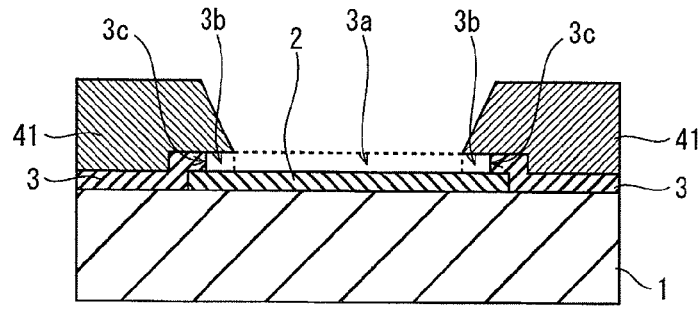
FIGS. 6A-6D are each process charts showing an example of steps of manufacturing the organic EL display panel in Embodiment 1 that follow the steps shown in FIGS. 4A-4E.
Figure 6B:
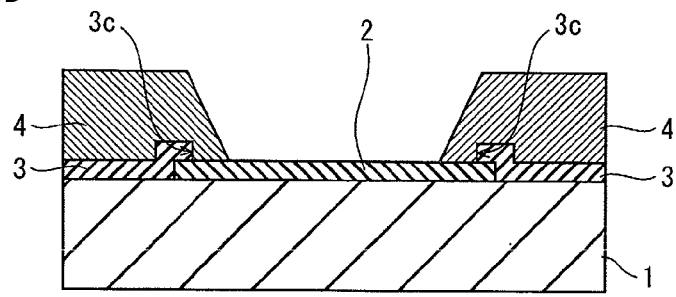
Figure 6C:
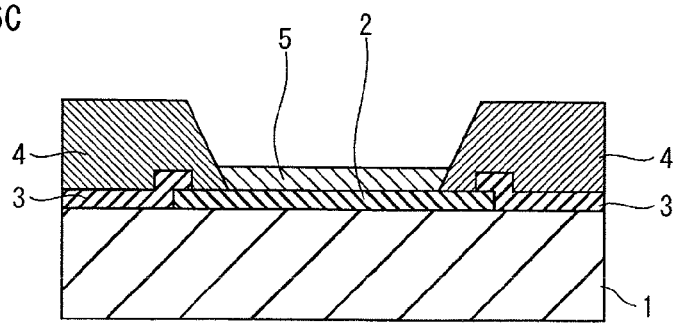

Next, as shown in FIG. 6C, the ink is dropped in an area defined by the banks 4 by the inkjet method or the like. By drying the ink, the organic light-emitting layer 5 is formed. Note that the organic light-emitting layer 5 may be formed by a dispenser method, a nozzle-coat method, a spin coat method, an intaglio printing, a letter press printing, or the like.

Next, a barium thin film as the electron injection layer 6 is formed using the vacuum evaporation method or the like. An ITO thin film as the second electrode 7 is then formed using the sputtering method or the like, and the sealing layer 8 is further formed (see FIG. 6D).

In the above-mentioned manufacturing method, since a portion of the bank material layer 41 formed on the residue removal layer 3 is removed together with the residue removal layer 3 by the development processing, it is possible to prevent the bank residue from being left on the first electrode 2. As a result, the increase of the drive voltage in the organic EL display panel 10 is suppressed. Furthermore, since the overhanging portion is softened so that the overhanging portion flows downward to be in contact with the first electrode 2, it is possible to prevent a problem such as uplift and detachment of the bank 4 from occurring.

<Shape of Bank after Development Processing and Shape of Bank after Baking Processing>

The inventors examined in experiments how a shape of the bank material layer 41 changes after the development processing and after the baking processing. Experimental conditions are as follows. The inventors used a glass substrate 1, APC and $MoWO_x$ as the substrate, the first electrode 2 and the residue removal layer 3, respectively. Note that ITO 2a was provided, as the transparent conductive film, on the first electrode 2 (see FIG. 7).

Regarding exposure conditions, the bank material layer 41 was exposed to light with an intensity of 300 mj/cm², and developed for 60 seconds using TMAH as the developer. The concentration of TMAH was 0.2%. The substrate was then washed for 30 seconds with pure water as a wash fluid. After being washed, the substrate was baked at a temperature of 220° C. for 60 minutes.

Figure 7B:
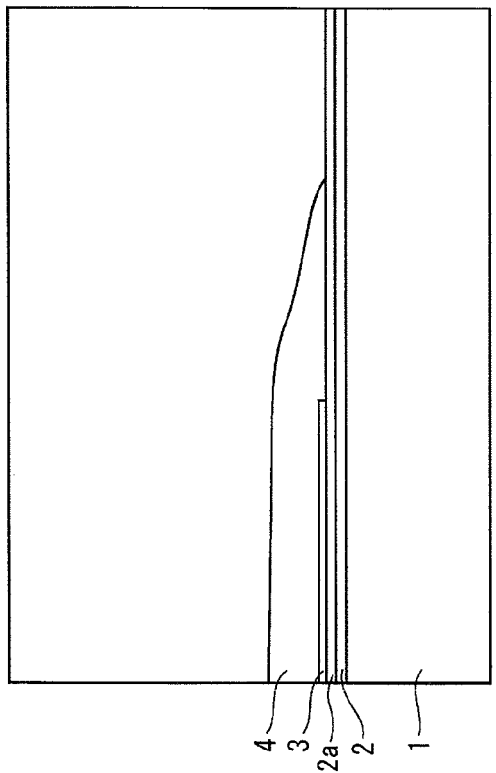
FIG. 7B is a schematic diagram obtained by tracing a photograph of the bank material layer after a baking processing.
Figure 7A:
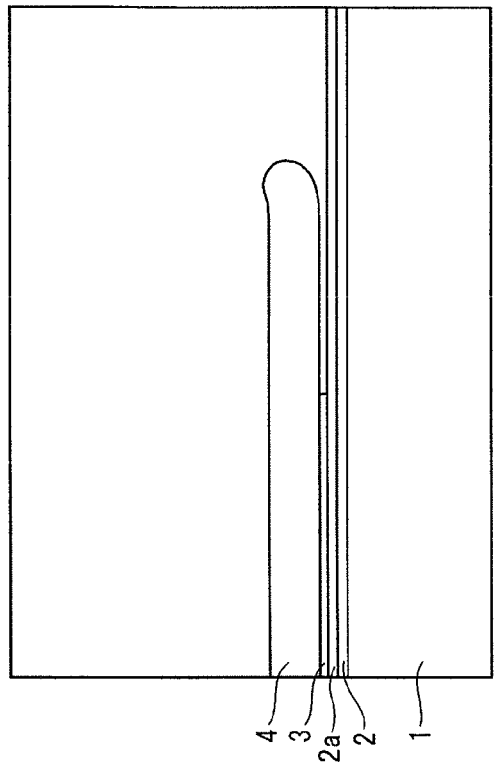
FIG. 7A is a schematic diagram obtained by tracing a photograph of a bank material layer after a development processing.

FIG. 7A is a schematic diagram obtained by tracing a photograph of a bank material layer 41 after the development processing. FIG. 7B is a schematic diagram obtained by tracing a photograph of the bank material layer 41 after the baking processing. As shown in FIG. 7A, since a part of $MoWO_x$ is removed by the side etching, the overhanging portion of the bank material layer 41 rises from the substrate after the development processing.

On the other hand, as shown in FIG. 7B, the overhanging portion of the bank material layer 41 above a space formed by the side etching is tapered and in contact with the substrate after the baking processing, because the overhanging portion flows downward by the baking processing.

As can be confirmed from the experimental results, the bank 4 formed by the baking processing fills a space formed by the side etching and covers a portion of the residue removal layer 3 exposed to the space.

(Supplement)

Although a description has been made on the organic EL display panel 10 pertaining to the present invention based on the above embodiment, the present invention is not limited to the above embodiment. For example, the following modifications can also be implemented.

(1) In the above embodiment, the first and second portions of the residue removal layer 3 are removed and the first electrode 2 is exposed by the wet process. The present invention, however, is not limited to this structure as long as at least surfaces of the first and second portions of the residue removal layer 3 are removed. This is because, as long as at least the surfaces are removed, it is possible to remove a portion of the bank material layer 41 formed on the residue removal layer 3 together with the surfaces. Accordingly, as shown in FIG. 8, for example, only a part including the surfaces of the first and second portions of the residue removal layer 3 may be removed and the first electrode 2 may not be exposed. When a configuration shown in FIG. 8 is adopted, it is preferable that the residue removal layer 3 be formed from a material having hole injection properties. With such a configuration, it is possible to effectively inject holes into the organic light-emitting layer 5. A method for manufacturing an organic EL display panel having such a configuration is briefly described with reference to FIG. 9.

The steps before the formation of the bank material layer 41 are as shown in FIGS. 5A-5C. The bank material layer 41 is then covered with a mask having an opening of a predetermined shape. The bank material layer 41 covered with the mask is exposed, and then an unnecessary portion of the bank material layer 41 is washed away with developer (e.g. TMAH). This completes the patterning of the bank material layer 41. During the above-mentioned wet process, the residue removal layer 3 also dissolves with the developer. However, the first electrode 2 is not exposed, and a portion of the residue removal layer 3 is left on the first electrode 2 (see FIG. 9A). Note that development conditions may be set appropriately, considering a thickness of the portion of the residue removal layer 3 to be left and the like.

During the wet process, since not only the first portion 3a of the residue removal layer 3 corresponding in position to an opening but also the second portion 3b of the residue removal layer 3 surrounding the first portion 3a dissolve, a space is formed under the bank material layer 41.

Figure 9A:
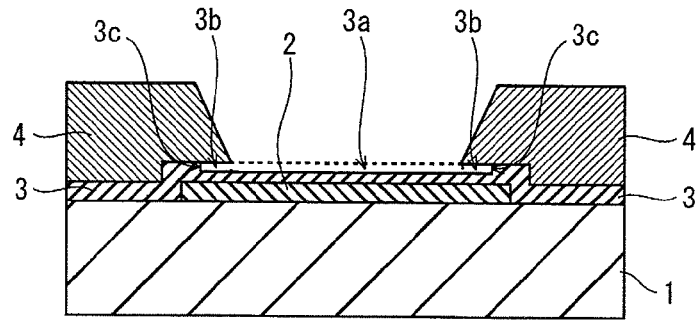
FIGS. 9A-9D are each process charts showing an example of steps of manufacturing the organic EL display panel in the modification of Embodiment 1.
Figure 9B:
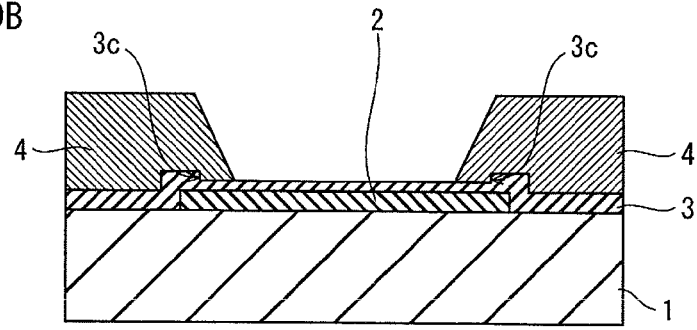

In order to solve such a problem, as shown in FIG. 6B, the substrate 1 is baked to soften the overhanging portion, so that the overhanging portion flows downward, and thus each bank 4 is formed (see FIG. 9B).

Figure 6D:
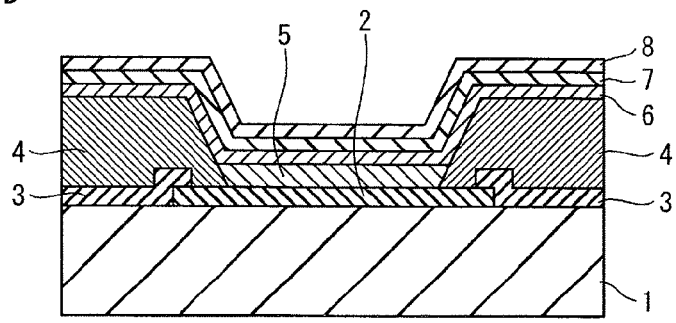
Figure 9C:
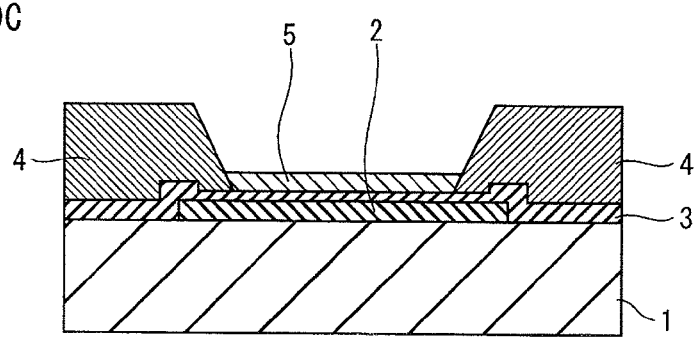
Figure 9D:
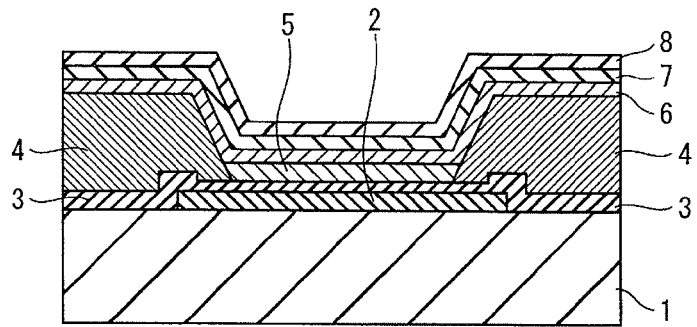

Subsequent steps shown in FIGS. 9C and 9D are respectively the same as those shown in FIGS. 6C and 6D. Therefore, a description thereof is omitted.

Note that the residue removal layer 3 may be formed from a material having hole transport properties. In such a case, by the residue removal layer 3 being left on the first electrode 2, it is possible to effectively transport holes to the organic light-emitting layer 5.

Figure 10:
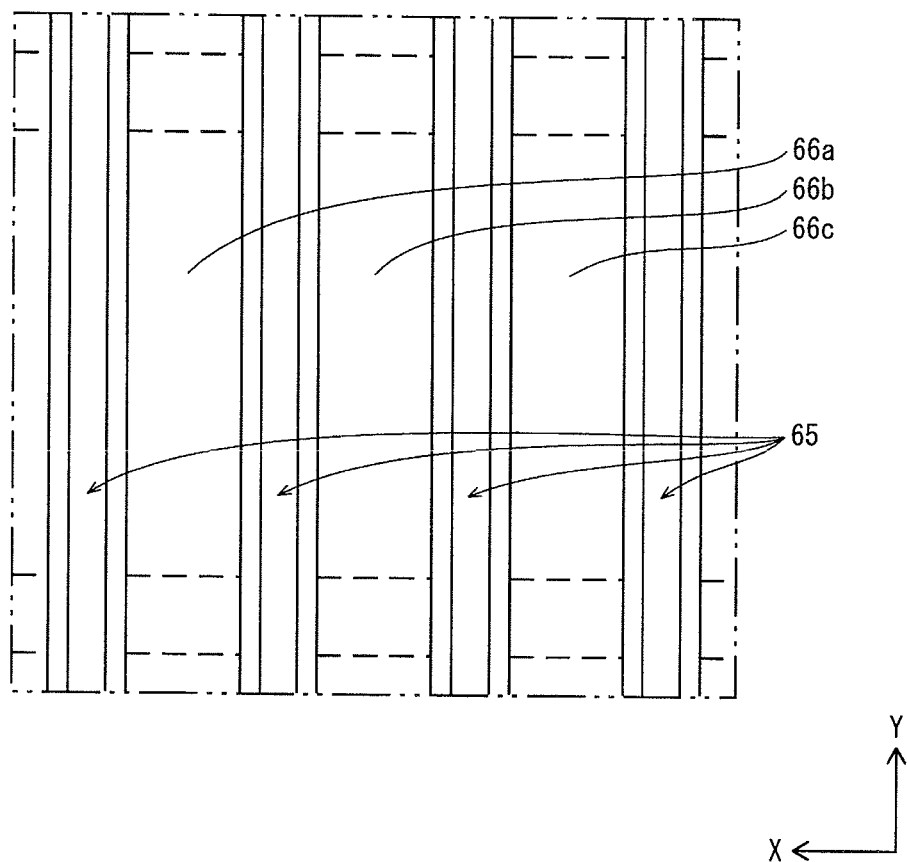
FIG. 10 is a plan view showing a part of the organic EL display panel in the modification of Embodiment 1.

(2) In the above embodiment, a so-called pixel bank structure in which banks are arranged in a lattice pattern is adopted. The present invention, however, is not limited to this structure. For example, a line bank structure in which banks are arranged in lines may be adopted. In an example shown in FIG. 10, the line bank structure is adopted. Each bank 65 delimits consecutive organic light-emitting layers 66a, 66b and 66c arranged along the X axis. Note that, in a case where the line bank structure is adopted as shown in FIG. 10, adjacent organic light-emitting layers arranged along the Y axis are not defined by a bank. However, by appropriately determining a driving method, a size of the anode, an interval between the anodes and so on, the adjacent organic light-emitting layers emit light without influencing each other.

(3) In the above embodiment, a top-emission type light-emitter is adopted. The light-emitter of the present invention, however, is not limited to the top-emission type light-emitter. A bottom-emission type light-emitter may be adopted.

(4) In the above embodiment, only the electron injection layer is interposed between the organic light-emitting layer and the second electrode. In addition to the electron injection layer, however, the electron transport layer may be interposed therebetween.

Figure 11:
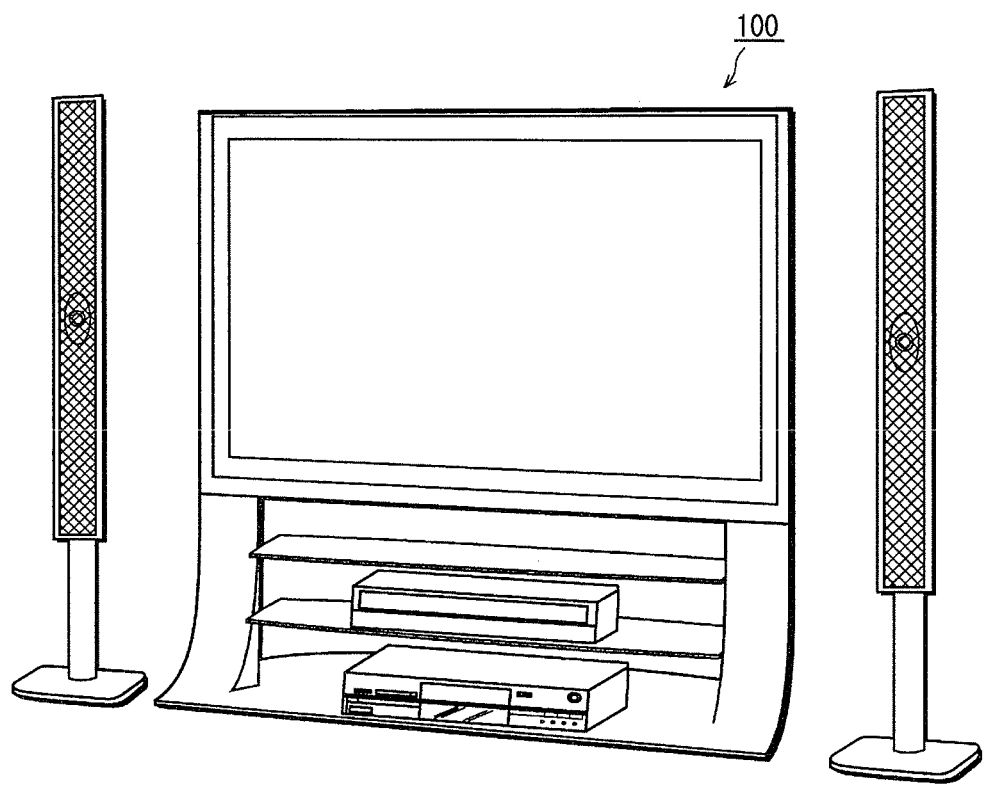
FIG. 11 is a perspective view showing an appearance of a display device 100.

(5) Although an appearance of the display device 1 is not described in the above embodiment, the display device 1 has an appearance as shown in FIG. 11, for example.

(6) In the above embodiment, a description has been made on the organic EL display panel included in the display device. The present invention, however, is not limited to this structure. For example, the present invention may be a light-emitter corresponding to one sub-pixel of the organic EL display panel.

(7) In the above embodiment, the display device has been taken as an example. The present invention, however, is not limited to this structure, and is applicable to a light-emitting device.

(8) In the above embodiment, a description has been made on a structure in which the organic light-emitting layer 5 is in contact with the first electrode 2 or the residue removal layer 3. The present invention, however, is not limited to this structure, and at least one of the hole injection layer and the hole transport layer may be interposed between the first electrode 2 and the organic light-emitting layer 5, or the residue removal layer 3 and the organic light-emitting layer 5.

(9) FIG. 7A is a schematic diagram obtained by tracing a photograph of a bank material layer after the development processing, and FIG. 7B is a schematic diagram obtained by tracing a photograph of the bank material layer after the baking processing. On the other hand, FIG. 12A is the photograph of the bank material layer after the development processing, and FIG. 12B is the photograph of the bank material layer after the baking processing.

Figure 12B:
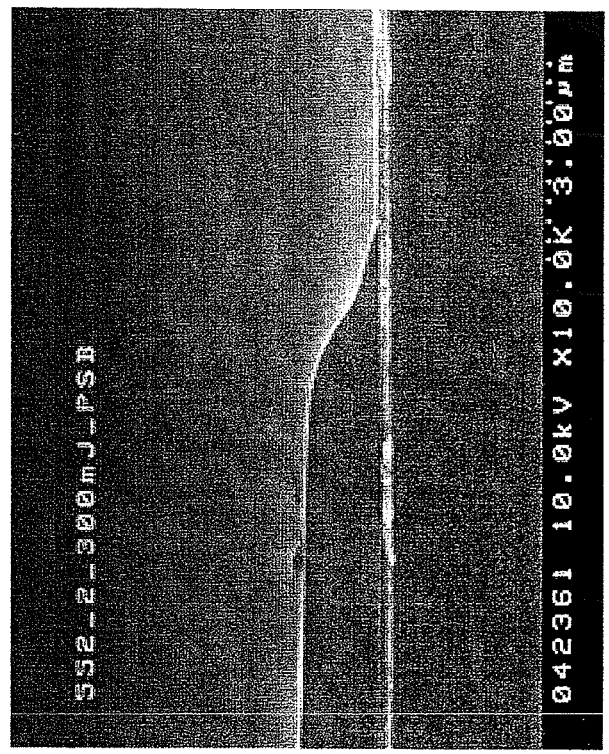
FIG. 12B is the photograph of the bank material layer after the baking processing.
Figure 12A:
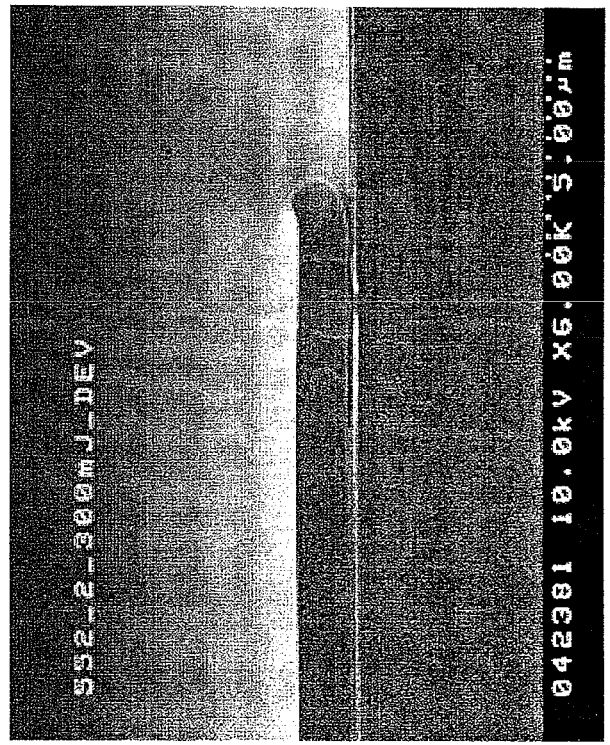
FIG. 12A is the photograph of the bank material layer after the development processing.

As can be confirmed from FIG. 12A, the overhanging portion of the bank material layer rises from the substrate after the development processing.

Also, as can be confirmed from FIG. 12B, the overhanging portion of the bank material layer above a space formed by the side etching is tapered and in contact with the substrate after the baking processing, because the overhanging portion flows downward by the baking processing.

As can be confirmed from the photographs shown in FIGS. 12A and 12B, the bank formed by the baking processing fills the space formed by the side etching and covers a portion of the residue removal layer exposed to the space.

INDUSTRIAL APPLICABILITY

The present invention is applicable to various display devices, television devices, display units for portable electronic equipment for used in homes, public facilities and businesses.

REFERENCE SIGNS LIST 100 display device
10 organic EL display panel
20 drive control unit
21-24 drive circuit
25 control circuit
1 TFT substrate
2 first electrode
3 residue removal layer
4 bank
5 organic light-emitting layer
6 electron injection layer
7 second electrode
8 sealing layer

The invention claimed is:

1. A method for manufacturing a light-emitter, comprising:
a first step of forming, on a substrate, an underlayer including a first electrode;
a second step of forming an interlayer on the underlayer;
a third step of forming, on the interlayer, a resin material layer including a photosensitive resin material;
a fourth step of, by partially exposing the resin material layer and then developing the resin material layer using developer in which the resin material layer and the interlayer are soluble, removing an uncured portion of the resin material layer to form an opening penetrating to the interlayer, and infiltrating the developer into the interlayer via the opening to remove at least surfaces of first and second portions of the interlayer, the first portion corresponding in position to the opening, the second portion surrounding the first portion;
a fifth step of forming each of a plurality of banks from the resin material layer by heating a portion of the resin material layer remaining after the fourth step to soften an overhanging portion of the resin material layer above a space formed by the surface of the second portion being removed, so that the overhanging portion flows downward to fill the space, cover a portion of the interlayer exposed to the space, and be in contact with the underlayer or the interlayer;
a sixth step of forming, in an area defined by adjacent banks of the plurality of banks, a functional layer including an organic light-emitting layer; and
a seventh step of forming a second electrode on the functional layer.

2. The method according to claim 1, wherein the interlayer and the resin material layer are etched with the developer.

3. The method according to claim 2, wherein
the interlayer is formed from any one of tungsten oxide, molybdenum oxide and tungsten-molybdenum oxide,
the resin material layer is formed from any one of acrylate resin, polyimide resin and phenolic resin, and
TMAH (tetra methyl ammonium hydroxide) is used as the developer.

4. The method according to claim 1, wherein
in the first step, the underlayer is formed from a material that is insoluble in the developer.

5. The method according to claim 4, wherein the underlayer includes only the first electrode formed from one of ITO and IZO.

6. The method according to claim 1, wherein
in the fifth step, the plurality of banks are formed so that the adjacent banks are out of contact with each other, and
in the sixth step, the functional layer is formed in the opening between the adjacent banks.

7. The method according to claim 1, wherein
a portion other than the surfaces of the first and second portions of the interlayer remains on the underlayer after the fourth step, and
the functional layer is formed on the remaining portion of the interlayer in the sixth step.

8. The method according to claim 7, wherein
the interlayer is a charge injection transport layer that injects and/or transports charge into the functional layer.

9. The method according to claim 8, wherein
the first electrode included in the underlayer is an anode, and
the charge injection transport layer is a hole injection layer that injects holes into the functional layer.

10. The method according to claim 1, wherein
the first and second portions of the interlayer are completely removed in the fourth step, and
the functional layer is formed on the underlayer in the sixth step.

* * * * *